(12) United States Patent
Jung

(10) Patent No.: US 8,879,328 B2
(45) Date of Patent: Nov. 4, 2014

(54) SENSE AMPLIFIER COLUMN REDUNDANCY

(71) Applicant: QUALCOMM Incorporated, San Diego, CA (US)

(72) Inventor: Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/837,874

(22) Filed: Mar. 15, 2013

(65) Prior Publication Data

US 2014/0269104 A1 Sep. 18, 2014

(51) Int. Cl.
*G11C 16/28* (2006.01)
*G11C 7/08* (2006.01)
G11C 16/04 (2006.01)
G11C 11/56 (2006.01)
G11C 16/26 (2006.01)

(52) U.S. Cl.
CPC ............... *G11C 7/08* (2013.01); *G11C 16/0483* (2013.01); *G11C 11/5642* (2013.01); *G11C 16/28* (2013.01); *G11C 16/26* (2013.01)
USPC .................. 365/185.21; 365/196; 365/189.02; 365/230.02

(58) Field of Classification Search
CPC ..... H01L 27/11; G06F 3/0689; G11C 7/1006; G11C 16/28; G11C 29/702; G11C 7/1042; G11C 2029/1204; G11C 16/26; G11C 11/5642; G11C 7/062; G11C 16/0483
USPC .................. 365/185.21, 196, 189.02, 230.02
See application file for complete search history.

(56) References Cited

U.S. PATENT DOCUMENTS

| | | | |
|---|---|---|---|
| 6,240,029 B1 * | 5/2001 | Callahan ..................... | 365/200 |
| 6,282,137 B1 * | 8/2001 | Lee et al. ..................... | 365/207 |
| 6,445,626 B1 * | 9/2002 | Hsu et al. ..................... | 365/200 |
| 7,495,978 B2 | 2/2009 | Hasegawa et al. | |
| 7,643,362 B2 | 1/2010 | Nagashima | |
| 8,004,913 B2 | 8/2011 | Gajjewar et al. | |
| 8,120,987 B2 | 2/2012 | Pilo et al. | |
| 2007/0038919 A1 * | 2/2007 | Sekiguchi et al. ............ | 714/763 |
| 2008/0273406 A1 | 11/2008 | Behrends et al. | |
| 2012/0163095 A1 | 6/2012 | Tanaka | |

* cited by examiner

*Primary Examiner* — Jason Lappas
(74) *Attorney, Agent, or Firm* — Haynes and Boone, LLP

(57) ABSTRACT

A memory includes a redundant sense amplifier and a plurality of sense amplifier pairs. Each sense amplifier pair includes a first sense amplifier and a second sense amplifier. Each sense amplifier pair drives a common load line. The memory is configured to implement column redundancy using a single redundant sense amplifier without requiring local read lines for each sense amplifier.

20 Claims, 4 Drawing Sheets

SENSE AMPLIFIER COLUMN REDUNDANCY

TECHNICAL FIELD

This application relates to memories with column redundancy, and more particularly, to a memory with I/O shifting column redundancy having increased density.

BACKGROUND

Column redundancy allows a memory array to replace a bad column with a redundant column. This redundancy can be performed using sense-amplifier (SA) shifting or I/O shifting. A memory 100 with sense-amplifier shifting is shown in FIG. 1. Two independent memory arrays or banks are included in memory 100: a bank 1 array and a bank 0 array. Each memory bank has its own set of sense amplifiers 101 for sensing the bit lines for memory bank. Each sense amplifier 101 senses from four corresponding bit lines 102 from its corresponding memory bank. In other words, there is a 4:1 bit-line multiplexing with regard to each sense amplifier 101 for a given memory bank. An array of read lines 104 are shared by sense amplifiers 101 for memory bank 0 and memory bank 1. The bit lines 102, memory cells in bank 0 and bank 1 as well as the corresponding sense amplifiers 101 and read line 104 are denoted herein as a "column." In other words, a column refers to the structure in any given memory bank to drive a sense amplifier's read line 104. That structure would of course include sense amplifier 101 and the associated bit lines 102 and memory cells coupled to those associated bit lines 102.

For illustration clarity, only a single initial column 135 and a subsequent column 135 are demarcated by dotted lines in memory 100. Each column 135 includes four corresponding bit lines 102 in memory bank 0 and memory bank 1. As known in the memory arts, each sense amplifier 101 is configured to respond to a sense enable signal (not illustrated). If the sense enable signal to a given sense amplifier 101 is asserted, that sense amplifier 101 will drive out a bit decision onto its read line 104.

Memory 100 responds to a read operation by outputting a retrieved word Dout from an output stage 120, Dout is a 32-bit wide retrieved word ranging from a first word bit Dout[1] to a last word bit Dout[32]. Each word Dout can either be an odd word or an even word depending upon whether it was sensed from odd or even columns. In other words, columns 135 are divided into even (E) and odd (O) columns. An even column includes an even sense amplifier for each memory bank. Similarly, an odd column includes an odd sense amplifier for each memory bank. A first even column and a first odd column correspond to Dout[1], depending upon whether the word is odd or even. Similarly, a second even column and a second odd column correspond to Dout[2], and so on such that a 32nd even column and a 32nd odd column correspond to Dout[32]. Given this odd or even value for each word bit, a first stage of 2:1 multiplexers 125 in output stage 120 enables an 8:1 bit line multiplexing with regard to each word bit.

Just like the odd and even column pairs, each multiplexer 125 corresponds to a bit position in the word Dout. For example, a first multiplexer 125 corresponds to Dout[1], a second multiplexer 125 corresponds to Dout[2], and so on. Each multiplexer 125 can select between the even and odd columns for its corresponding word bit with regard to its S1 and S2 inputs. For example, an initial multiplexer 125 receives the read line 104 for the first even column 135 at its S2 input and receives the read line 104 for the first odd column at its S1 input. Each multiplexer 125 may thus be considered to receive an odd input and an even input.

The sense enable signal to sense amplifiers 101 differentiates between even and odd columns and also between banks. The sense enable signal for a given memory bank may thus have a even state that triggers the sensing of the even bits from the even sense amplifiers and have an odd state that triggers the sensing of the odd bits from the odd sense amplifiers. In a default state (no column errors), multiplexers 125 are then controlled to select for their odd or even inputs depending upon whether Dout is an odd or even word.

Because of the sharing of a single read line 104 across both memory banks, a defect in just the memory bank 1 portion or in just memory bank 0 portion of a given column 135 destroys the usefulness of that even or odd column. Such a defective column is replaced in a sense-amplifier redundancy scheme by a subsequent column for the same odd or even class. To perform this replacement requires a second stage of multiplexers 130.

There is one multiplexer 130 for each word bit. Thus, a first multiplexer 130 selects for Dout[1], a second multiplexer 130 selects for Dout[2], and so on. Because of the two stages of 2:1 multiplexing, each multiplexer 130 except for a last multiplexer 130 for Dout[32] can ultimately select from the bit decisions from two even and odd column pairs. A bit decision from the even and odd column pair for a given word bit may be said to be the unshifted bit decision for that output bit's multiplexer 130. For example, a bit decision from the first bit even and odd columns would be an unshifted bit decision for the multiplexer 130 for Dout[1]. In addition, each multiplexer 130 from the first multiplexer 130 through a next-to-last multiplexer 130 has an S1 input for receiving a hit decision from the subsequent bit's even and odd column pair. This bit decision may be denoted as the shifted bit decision. For example, the first multiplexer 130 can select for the bit decision from the second bit even and odd column pair at its S1 input. But there is no subsequent column for the thirty-second bit's even and odd column. The S1 input for this final bit's multiplexer 130 receives a redundant read line 145 from a redundant column 140. Redundant column 140 includes a redundant sense amplifier 105 for sensing from redundant bit lines 110 in each memory bank.

Note that redundant column 140 can be either an even or odd column depending upon whether memory 100 has a defective even or odd column. In other words, redundant sense amplifiers 105 respond to the sense enable signal regardless of whether the sense enable signal is in the even or odd state. Should there never be any defective columns in memory 100, there would be no need for any multiplexers 130. But in a sense-amplifier shifting scheme, a defective even or odd column is replaced by the immediately subsequent column for its even or odd class. For example, suppose the first bit even column is defective. The function of this initial even column 135 would then be assumed by the second bit even column, which is the subsequent even column to the defective first bit even column.

To enable such a replacement of a given defective even or odd column, each multiplexer 130 can either select for its unshifted (S2) input or a shifted (S1) input. For example, suppose an even column is defective but an odd word is being read from memory 100. In such a case, each multiplexer 130 is controlled to select for its unshifted input. But when an even word is sensed, multiplexers 130 are controlled to select for either their shifted or unshifted input depending upon their bit position with regard to the defective column. For example, suppose the defect is in an ith even column, where i is an integer designating the bit position of the column. Multiplexers 130 prior to this bit position perform no shift. But multiplexers 130 corresponding to the ith bit position and onward are controlled to select for their shifted input. Redundant column 140 would then function as the last (thirty-second in this embodiment) even column. If the ith odd column were defective, an analogous control would occur for multiplexers 130 when an odd word is being read from memory 100. But redundant column 140 would then function as the last odd column. Such SA shifting through multiplexers 125 and 130 demands rather complicated control logic. Moreover, note each even and odd column has its own read line 104, which complicates the resulting routing and layout.

Instead of SA shifting, an I/O shifting redundancy scheme may be implemented. FIG. 2 shows an I/O shifting redundancy scheme for an 8:1 bit line multiplexing (muxing) memory 200. There is no need for a second stage of multiplexers in an I/O shifting redundancy scheme. Instead, a single stage 201 of 2:1 multiplexers 210 can select for the word Dout. In memory 200, the word Dout is again thirty-two bits wide, ranging from bit Dout [1] to bit Dout [32]. Columns 202 are organized as discussed with regard to the even and odd column pairs of memory 100. Thus, each even and odd column pair corresponds to a bit position in Dout in a default (no defective column) state. There is a first pair of even and odd columns corresponding to Dout [1], a second pair corresponding to Dout [2], and so on such that a final column pair (in this embodiment, a thirty-second column pair) corresponds to Dout [32].

Each column 202 comprises the memory cells (not illustrated) and 4 bit lines associated with a corresponding sense amplifier 205, which may be classified as an even or odd sense amplifier depending upon the column type, But unlike memory 100, each read line 206 is shared by a sense amplifier of each type within a memory bank: one odd sense amplifier and one even sense amplifier. To distinguish such a shared read line for a corresponding set of sense amplifiers in a memory bank, read lines 206 will be denoted as load lines. In contrast, the term "read line" will be reserved for applications such as memory 100 in which a read line is not shared by other sense amplifiers within any given memory bank. A load line 206 is shared by the even and odd sense amplifiers in each column pair. Load lines 206 are received by an I/O block 201 including 2:1 multiplexers 210. Like multiplexers 130, each multiplexer 210 can select from an unshifted column pair or a shifted column pair. For example, the multiplexer 210 for Dout[1] can select for the unshifted column pair (the first pair) at its S1 input and for the shifted column pair (the second pair) at its S2 input. But there is no shifted column corresponding to Dout[32]. Thus, the multiplexer 210 for Dout[32] selects for a redundant load line 211 for a redundant column pair 240 as its shifted input.

Because each column pair shares a common load line 206, it will be defective even if just one of its odd or even columns is defective. The I/O shifting thus takes place with regard to sense amplifier pairs (or equivalently, column pairs) and is not sensitive to whether the specific defective column is odd or even. The control logic for multiplexers 210 is thus simplified as compared to a SA shifting scheme. For example, suppose a given column pair is defective. In a default case (no errors), this given column pair corresponds to given one of the output bit positions. This bit position may be designated as Dout [i], where i represents some arbitrary bit. The multiplexers 210 corresponding to Dout [1] through Dout [i−1] select for their unshifted load line whereas the remaining multiplexers 210 select for the shifted load line. The shifting logic is thus rather elementary but I/O shifting requires a redundant column for each word type. For example, if memory 200 were modified to store four types of words (suppose they are named arbitrarily as types A, B, C, and D) as opposed to just storing even and odd words, it would need a redundant A column, a redundant B column, a redundant C column, and a redundant D column. But a SA shifting memory uses a generic column that can substitute for any of the column types. As compared to SA shifting, I/O shifting thus demands more die area. However, another advantage of I/O shifting is that the number of load lines 206 that are routed to multiplexers 210 equals the word width (plus the redundant load line 211). In contrast, the number of read lines for a SA shifting memory will equal a multiple M of the word width (plus the redundant read line 145), where M is an integer representing the number of word types.

There is thus a need in the art for a redundancy scheme that achieves the die savings of sense-amplifier shifting and the control logic simplicity and read-line routing simplicity of I/O shifting.

SUMMARY

An improved column redundancy scheme uses a single generic column despite the use of load lines instead of local read lines. As used herein, a "column" is defined to correspond to a sense amplifier and its corresponding bit lines and associated memory cells. The columns are classified into different types corresponding to the different word types that are stored in the resulting memory. For example, a memory may store even and odd words that are sensed by even and odd sense amplifiers in corresponding even and odd columns. But a column type is a broader concept than just even and odd in that a memory may have any number of word types.

The columns are organized into load lines sets. Each load line set has one column of each type. The sense amplifiers in a load line set all share a corresponding load line. In other words, each sense amplifier in a load line set can drive its bit decision onto the corresponding load line. The memory also includes a generic column that includes a generic sense amplifier. This generic column will have the same bit line multiplexing of the non-redundant columns. For example, if the bit line multiplexing for a sense amplifier in a load line set is 4:1, then the redundant sense amplifier would have this same 4:1 bit line multiplexing.

The load lines are all received at a plurality of multiplexers. The multiplexers, like the load lines, correspond to the word width for the memory. If each word (regardless of type) is considered to range from a first bit to a last (mth) bit, then the load lines range from a first load line to a last (mth) load line and the multiplexers range from a first multiplexer to a last multiplexer, where m is an integer equaling the word width. Each multiplexer from the first multiplexer through a next-to-last multiplexer can select from the corresponding load line as well as a shifted load line. The corresponding load line for the first multiplexer is the first load line, the corresponding load line for the second multiplexer is the second load line, and so on such that the corresponding load line for the last multiplexer is the last load line.

With regard to the arrangement of the load lines from a first load line to a last load line, a shifted load line is the subsequent load line to any given load line except for the last load line. In other words for an ith load line (where i ranges from 1 to m−1), the shifted load line is the (i+1)th load line. There is no shifted load line to the last load line since it is the last of the load lines. Unlike the other multiplexers, the last multiplexer can select from the last load line and a redundant read line coupled to the redundant sense amplifier in the single redundant column.

DETAILED DESCRIPTION

Figure 1:
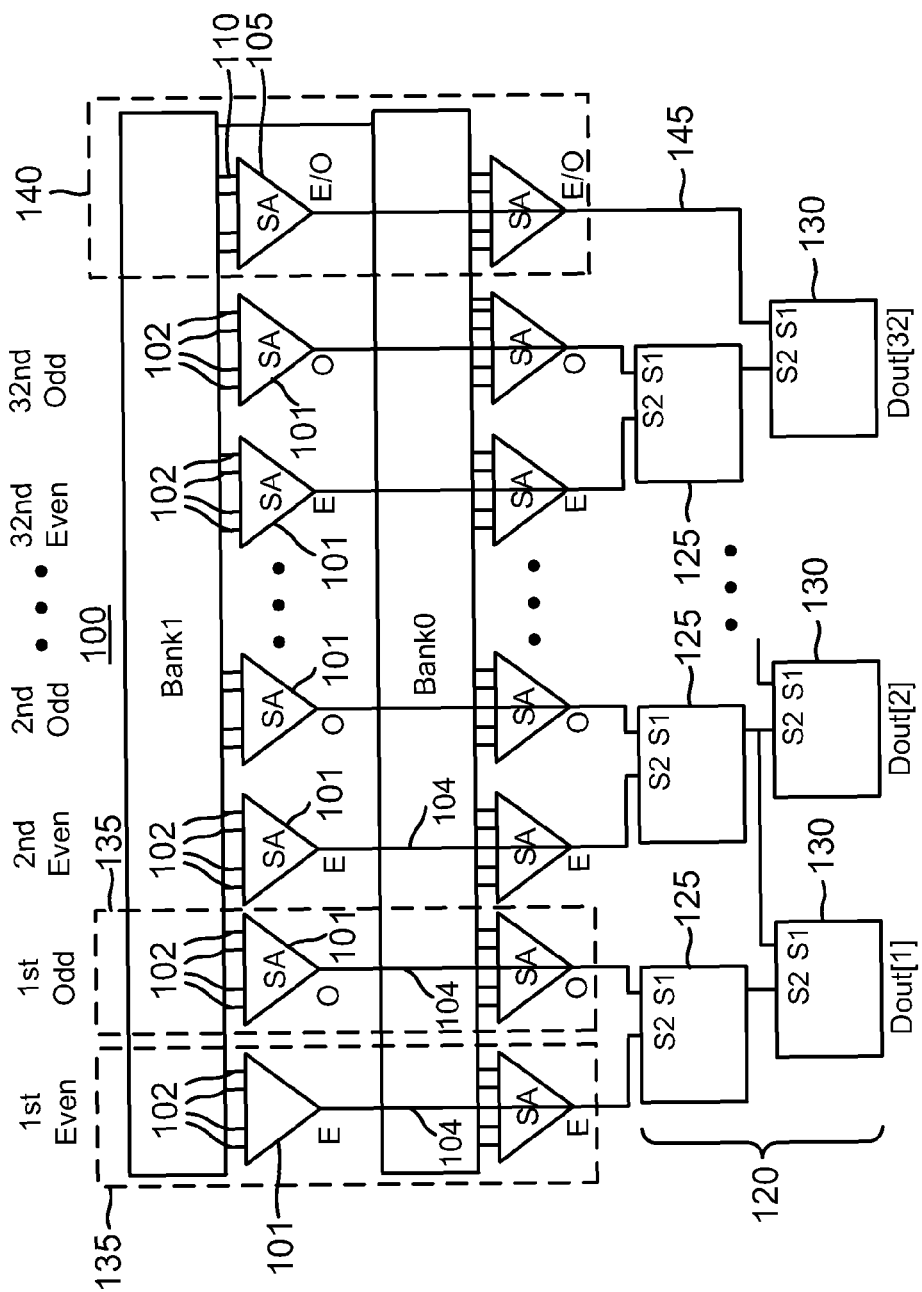
FIG. 1 is a block diagram of a conventional memory configured to use a sense-amplifier shifting redundancy scheme.
Figure 2:
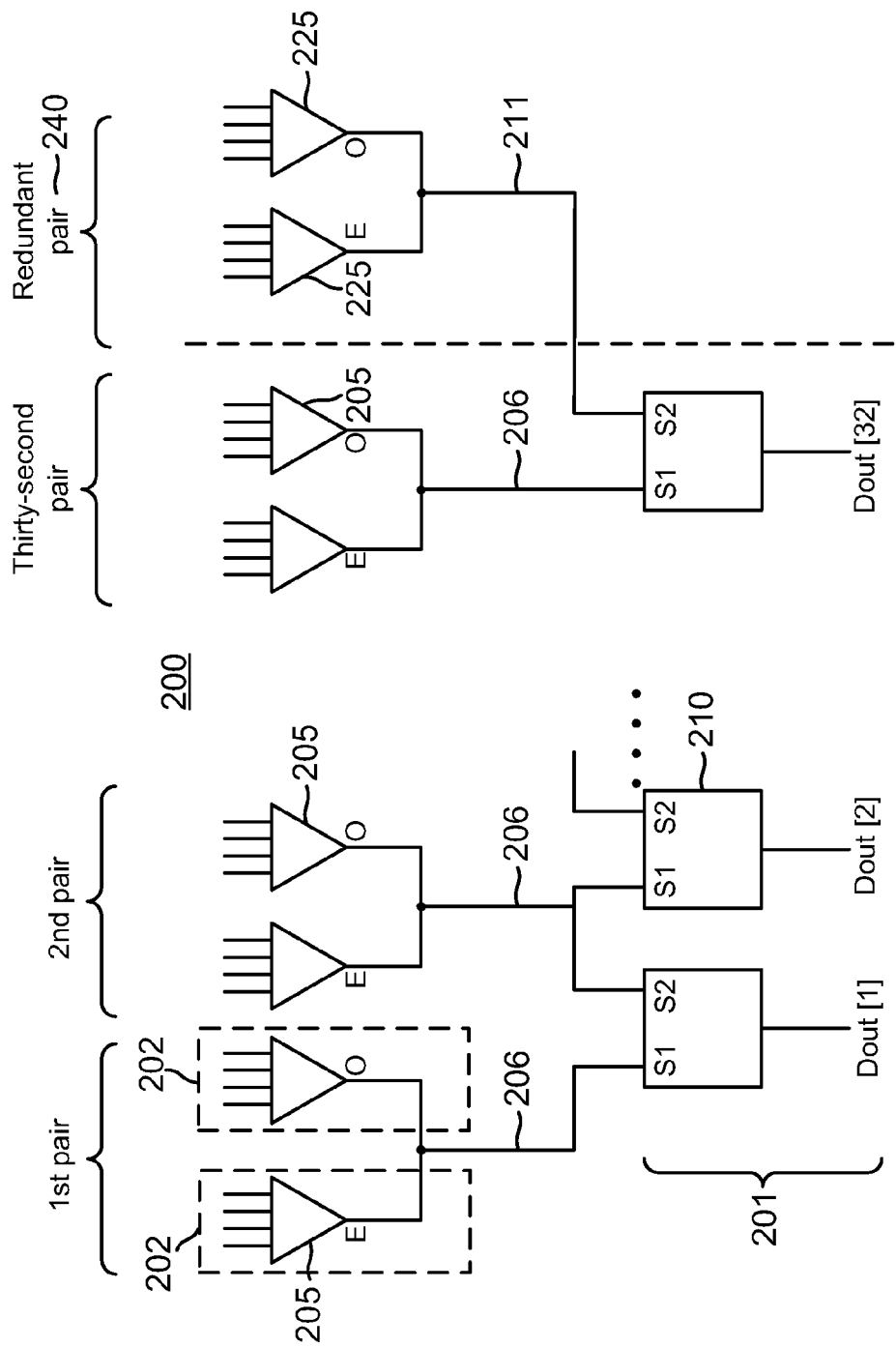
FIG. 2 is a block diagram of a conventional memory configured to use an I/O-shifting redundancy scheme.

Improved column redundancy schemes are provided for memories in which common load lines are shared by multiple columns. The memories may include one or more memory banks. Each column includes a sense amplifier for each memory bank. The columns are classified according to the word type that they are configured to sense. Such a classification flows from the shared load lines as will be appreciated by those of ordinary skill in the memory arts. For example, if a memory is configured to store four different word types, there would be four corresponding column types. Since each load line is shared by a column of each type, a load line is shared by four columns in such an embodiment.

In general, the number of column types and corresponding word types depends upon, among other factors, the resulting aspect ratio of the memory. The following discussion will assume that there is a first column type and a second column type such that corresponding first-type words and second-type words may be read from the resulting memory. Without loss of generality, the first column type may be denoted as an even column and the second column type may be denoted as an odd column. Even words are thus read from the even columns whereas odd words are read from the odd columns. But it will be appreciated that the column redundancy structures and methods disclosed herein are widely applicable to any given configuration of column types and corresponding word types.

Those of ordinary skill will also appreciate that some means is necessary to select for a particular memory bank and column type because of the load line sharing. For example, the sense amplifier (or amplifiers) in each column may be configured to respond to a bank-specific and column-specific sense enable signal. In this fashion, the sense amplifiers in a given column type may be selectively activated to provide bit decisions. In an even and odd column embodiment, the sense amplifiers are classified as even and odd sense amplifiers according to their column type. Each shared load line and corresponding pair of even and odd columns may be considered to correspond to the word width. In other words, each load line corresponds uniquely to a bit position for the output word. In that regard, the even and odd words will all have the same width in bits, ranging from a first bit in a first bit position to a last bit in a last bit position. The column pairs (each pair including an even column and an odd column) are thus arranged according to the output bit width. A first column pair corresponds to the first bit position, a second column pair corresponds to the second bit position, and so on such that a final column pair corresponds to the last bit position.

An output stage for the improved column-redundancy memories disclosed herein includes a single stage of 2:1 multiplexers corresponding to the bit positions just like the column pairs. Thus, there is a first multiplexer for selecting for the output bit in the first bit position, a second multiplexer configured to select for the output bit in the second bit position, and so on, such that there is a last multiplexer for selecting for the output bit in the last bit position. Each multiplexer can select for a shifted or an unshifted column pair analogously as discussed with regard to multiplexers 210 in an I/O shifting scheme. But in sharp contrast to an I/O shifting embodiment, the improved column redundancy memories disclosed herein do not need a redundant column for each column type. Instead a single generic redundant column functions to replace whatever column type is defective. This is quite advantageous in that the die savings of SA shifting is achieved with the simplified load line routing of I/O shifting.

The number of load lines depends upon the word width. Thus, if each output word Dout is m bits wide (m being an arbitrary positive integer), then there would be m load lines in one embodiment. The number of multiplexers also corresponds to the word width. In an m-bit wide embodiment, a first multiplexer receives a first load line, a second multiplexer receives a second load line, and so on such that an mth (final) multiplexer receives the mth load line. Each multiplexer (except for the mth multiplexer) also receives the subsequent load line. Thus, an ith multiplexer (where i is an integer ranging from 1 to m−1) receives the ith load line (from the unshifted column pair) and the (i+1)th load line (from the shifted column pair). As used herein, a "subsequent load line" for a given load line corresponds to the next bit position with reference to the bit position for the given load line. In that regard, there is no subsequent load line after the last load line. A first multiplexer thus selects between the first and second load lines, a second multiplexer selects between the second and third load lines, and so on. But a final multiplexer selects between the final load line and a redundant load line corresponding to the single redundant column.

Figure 3:
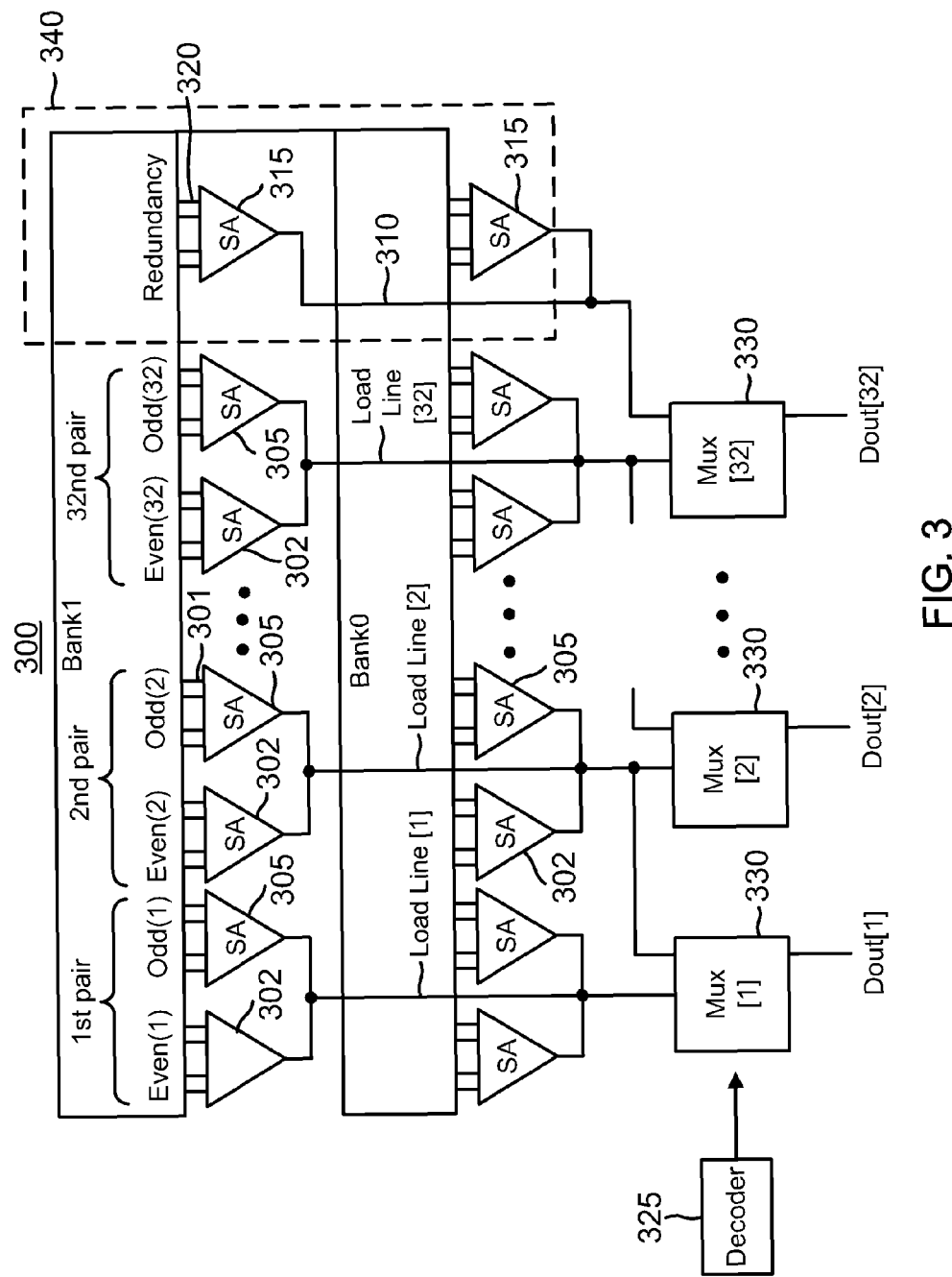
FIG. 3 is a block diagram of a memory configured with an improved column redundancy scheme.

An example memory 300 is shown in FIG. 3 to better illustrate these advantages. In this embodiment, there are two memory banks: a memory bank 0 and a memory bank 1. But the number of memory banks is arbitrary—it may be one or more. In memory 300, the word width is thirty-two bits, ranging from a first word bit Dout [1] to a thirty-second word bit Dout [32]. There are thus thirty-two load lines for such an embodiment, ranging from a load line [1] to a load line [32]. Each load line is shared by corresponding sense amplifier pairs in each memory bank. Load line [1] is the default (unshifted) load line for Dout [1]. Similarly, load line [2] is the unshifted load line for Dout [2], and so on such that load line [32] is the unshifted load line for Dout [32]. Each word bit is selected for by a corresponding 2:1 multiplexer 330. There are thirty-two multiplexers 330 for memory 300 corresponding to the thirty-two bits in the word Dout. In general, if the word Dout is m-bits wide, there would be m multiplexers 330, where m is an arbitrary positive integer. Load line [1] is received by a first multiplexer 330 (the initial multiplexer). Similarly, load line [2] is received by the adjacent second multiplexer 330, and so on such that load line [32] is received by a thirty-second multiplexer 330.

Each load line is driven in each memory bank by a corresponding even sense amplifier 302 and odd sense amplifier 305 in a corresponding column pair. The even and odd sense amplifiers in the first column pair thus drive their bit decisions onto load line [1], a second column pair drives load line [2], and so on such that the final column pair drives load line [32]. Within each memory bank for a given column pair, each sense amplifier 305 and 302 senses from four corresponding bit lines 301 (a 4:1 bit-line muxing). A first one of multiplexers 330 up to a next-to-last one of multiplexers 330 (in this embodiment, the 31$^{st}$ multiplexer) can select an unshifted load line and a shifted load line. Thus, a first multiplexer 330 is controlled to select for a bit decision carried either on load line [1] or load line [2], a second multiplexer 330 is controlled to select for a bit decision carried on either load line [2] or load line [3], and so on such that a next-to-last multiplexer (not illustrated) selects between load line [31] (not illustrated) and load line [32].

The word Dout from multiplexers 330 is either an even word if the even sense amplifiers 302 are driving their respective load lines or an odd word if the odd sense amplifiers 305 are driving their respective load lines. An even word Dout is thus sensed by even sense amplifiers 302 whereas an odd word Dout is sensed by odd sense amplifiers 305. As discussed previously, each sense amplifier type is configured to sense from its multiplexed bit lines responsive to a sense enable signal for its type (and for its memory bank). In this fashion, the sense amplifier types do not interfere with each other despite the use of a shared load line. Since such sense amplifier enable signals are well known in the memory arts, their interaction with their corresponding sense amplifiers is not illustrated for memory 300.

There are no non-redundant sense amplifiers after the thirty-second column pair so there is of course no shifted load line for the final thirty-second multiplexer 330 to select from. Instead, the final multiplexer 330 selects from its unshifted load line (in this embodiment, load line [32]) and a redundant load line 310 from a redundant column 340. Redundant column 340 includes a redundant sense amplifier 315 for each memory bank. Within each memory bank, the corresponding redundant sense amplifier 315 senses from four redundant bit lines 320 and their associated memory cells. As will be explained further herein, each redundant sense amplifier 315 is generic in that it will respond to all the sense enable signals. In this fashion, redundant sense amplifier 315 can assume the role of whatever sense amplifier type that is defective in the corresponding memory bank. In a default state (no errors), redundant column 340 plays no role for the reading of the word Dout because each multiplexer 330 is controlled to select for the bit decision carried on the unshifted load line. Since there is an odd and an even sense amplifier coupled to each load line, there is an 8:1 bit-line multiplexing per memory bank with regard to the reading of a word Dout from memory 300.

In contrast to memory 300, a conventional I/O shifting memory such as memory 200 having an 8:1 bit line muxing would require a pair of redundant columns having corresponding sense amplifiers 225 in each memory bank. The die savings are increased as the bit line multiplexing is increased. For example, memory 300 could be modified such that each load line is shared by four types of sense amplifiers so that a 16:1 bit line multiplexing per memory bank is achieved with regard to the read operation. But there would still be a single redundant column 340. In contrast, a conventional 16:1 I/O shifting memory would require four redundant columns.

This advantageous die savings may be better appreciated in reference to an example defect. As used herein, a sense amplifier (or its column with regard to the particular bank for this sense amplifier) is said to be "defective" regardless of whether the defect lies in it or instead is some defect in the corresponding bit lines 301 or in the memory cells associated with those bit lines. With this definition in mind, suppose an even sense amplifier 302 in bank 1 is defective but an odd word is being read from bank 1. In that case, there is no shifting by any of multiplexers 330 because all the odd sense amplifiers 305 are working (non-defective). A decoder 325 controls the multiplexers 330 accordingly to not shift in that case. In such a case, each multiplexer 330 selects for the bit decision carried on its unshifted load line. But when an even word is read from memory 300, multiplexers 330 are controlled to shift. Such shifting occurs analogously as discussed with regards to memory 200. The multiplexers 330 preceding a load line for a defective column pair will not shift. In other words, suppose that the even sense amplifier in the ith column pair is defective. The multiplexers for Dout [1] through Dout [i−1] would be controlled by decoder 325 to select for their unshifted load line. But the multiplexers for Dout[i] through Dout[32] would be controlled by decoder 325 to select for their shifted load line.

The analogous behavior occurs if the odd sense amplifier in the ith column pair is defective for a given memory bank. If an even word Dout is being read from that memory bank, then decoder 325 controls multiplexers 330 to select for their unshifted load line. But if an odd word Dout is being read, decoder 325 controls multiplexers 330 such that multiplexers 330 for Dout[1] through Dout[i−1] select for their unshifted load line. Conversely, decoder 325 would also control multiplexers for Dout[i] through Dout[32] to select for their shifted load line. But there is no need for a pair of redundant columns. In this fashion, memory 300 enjoys the routing simplicity of I/O shifting while achieving the die savings of sense amplifier shifting.

To achieve further density reduction, the load lines may be shared by additional memory banks such as a bank 2, a bank 3, and so on (not illustrated). Each bank would have its own redundant sense amplifier and redundant bit lines as discussed with regard to banks 0 and 1.

As noted above, a defect may lie in a memory cell attached to a given bit line, in the bit line itself, or in the sense amplifier sensing the defective memory cell or its bit line. Thus, as used herein, a defect denoted as corresponding to an even or odd sense amplifier does not necessarily mean that the sense amplifier itself is defective but instead means that the read operation desired through the sense amplifier is defective (for whatever reason that may lie in the hardware). Once manufactured, memory 300 can be tested to determine whether a defect corresponds to any of the even sense amplifiers 302 or odd sense amplifiers 305. In that regard, memory 300 can be generalized such that the words being read have a width from a first bit to a last nth bit (where n is an arbitrary plural positive integer). The multiplexers, the load lines, and the column pairs would thus also be arranged with regard to the first bit to the nth bit. Testing the memory would then identify the bit position for the defect and whether it is odd or even. For example, the defect may correspond to the ith even sense amplifier, where i is an arbitrary integer ranging from 1 to n. In that case, decoder 325 would not command for any multiplexer shifting if an odd word is being read. Similarly, decoder 325 would not command the multiplexers prior to the ith bit to shift if an even word is being read. But decoder 325 would command the multiplexers from the ith bit to the nth bit to shift (select for their shifted load line) if an even word is being read in the case of the defect for the ith even sense amplifier. An analogous control would occur if a defect corresponds to an ith odd sense amplifier.

The use of the words "odd" and "even" merely designate the different sets of sense amplifiers corresponding to the different sets of words stored in the memory. In that regard, the "odd" words need not have an odd address but instead just represent an arbitrary set of words. Similarly, the "even" words need not have an even address. The advantageous column redundancy disclosed herein is thus readily extended to memories having more than two word types. For example, if each load line corresponds to four sense amplifiers, then there would be one each of the four corresponding sense amplifier types for each memory bank in the corresponding column. Thus, it will be appreciated that the designation of "odd" and "even" sense amplifiers herein is not limiting but instead applies to arbitrary sets or types of words and their corresponding sense amplifiers sets or types. The collection of sense amplifiers sharing a given load line within a memory bank is denoted herein as a "load line set." Because a column type is indistinguishable from its sense amplifier type, a load line set may also refer to the corresponding columns that couple to a given load line.

If the even and odd sense amplifiers are generalized as first and second sense amplifiers such that the common load line set would include additional sense amplifiers such as a third sense amplifier and a fourth sense amplifier, the preceding discussion would still apply to such a memory. In other words, even though there would be other types of sense amplifiers for each load line, each load line would couple to a pair of the first and second sense amplifiers. Suppose that the first sense amplifier for a given memory bank and load line is defective. If a word of any type but the first type is being read from that bank, there would still be no shifting by any of multiplexers 330. But if a word of the first type is being read from that bank, the shifting by multiplexers 330 would occur as discussed above. In general, the type of the defective sense amplifier determines the unshifted word types. In other words, the reading of all words having types besides the type corresponding to the defective sense amplifier is provided through unshifted multiplexers 330. But if a word having a type corresponding to the defective sense amplifier type is being read, multiplexers 330 are controlled to shift as discussed above.

Note that the logic carried out by decoder 325 is analogous to that performed by a decoder controlling multiplexers 130 in the SA shifting redundancy scheme discussed with regard to FIG. 1. In both cases, multiplexers 130 and multiplexers 330 are controlled to shift when a word type is being read corresponding to a defective sense amplifier type but not to shift otherwise. The decoder logic for a SA shifting redundancy scheme has the added complication, however, of the control of the first stage multiplexers 125. Since decoder 325 thus performs a simplified version of the conventional SA shifting decoder logic, circuitry for decoder 325 is not illustrated as one of ordinary skill in the SA shifting arts would recognize how design it. But what is not taught by conventional SA shifting schemes is how to use a generic redundant column yet have a common read line set of sense amplifiers for each common load line set. Instead, as discussed with regard to memory 100, SA shifting requires dedicated read lines for each sense amplifier in a given memory bank. This leads to the routing complications that are avoided by memory 300. So memory 300 gets the advantages of both SA shifting and I/O shifting without their concurrent disadvantages.

A Method of Operation

Figure 4:
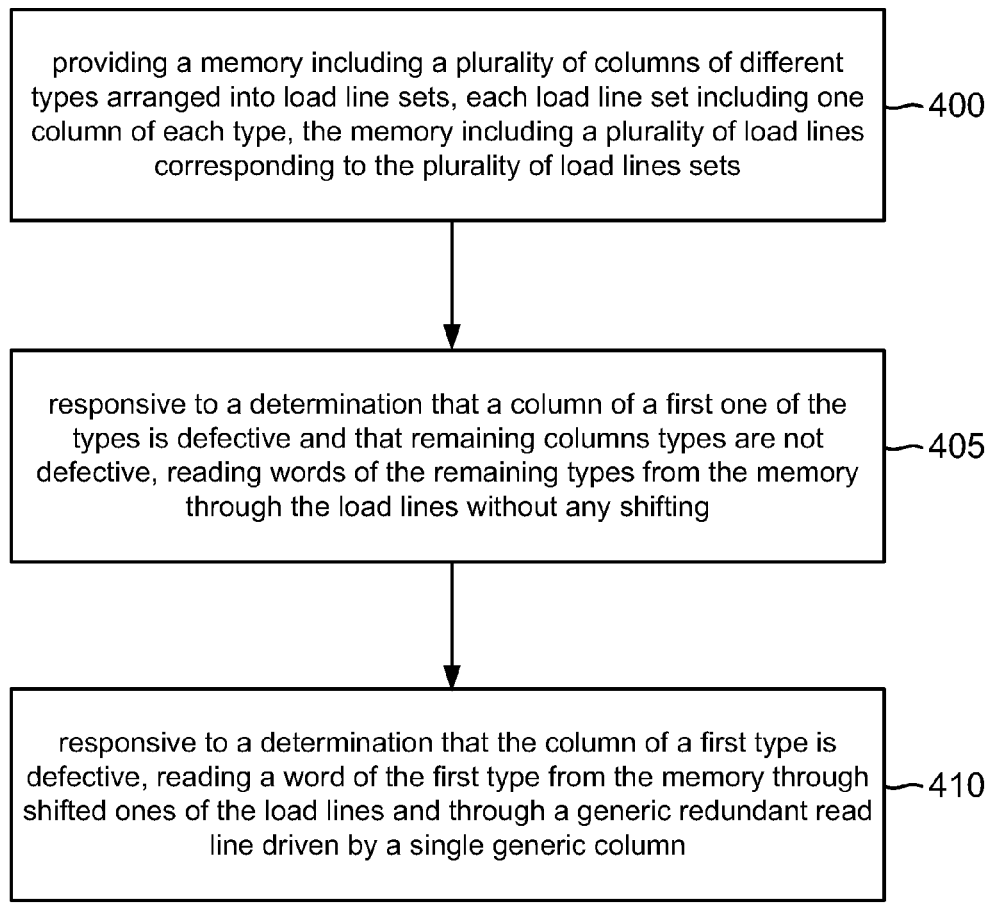
FIG. 4 is a flowchart for an example method.

A flowchart for an example method of operating a memory such as memory 300 is shown in FIG. 4. In a step 400, a memory is provided that includes a plurality of columns of different types. The columns are arranged into load line sets such that each load line set includes one column of each type. The memory also includes a plurality of load lines corresponding to the plurality of load lines sets. Each load line is coupled to the sense amplifiers in the columns of the corresponding load line set.

In a step 405, a determination has been made that a column of a first one of the types is defective but that the remaining columns are not defective. Responsive to this determination, words of the remaining types (besides the first type) are read from the memory through the load lines without any shifting.

In a step 410, a word of the first type is read from the memory through shifted ones of the load lines and a redundant read line driven by a single generic column. Such a method is distinguishable from SA shifting because there are no local read lines—each load line is shared by the sense amplifiers in the corresponding load line set. The method is also distinguishable from I/O shifting because there is no shifting when words of any type besides the defective type are read from the memory. In this fashion, a single redundant column can substitute for whatever column type that is defective.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
   a plurality of load lines arranged from a first load line to a last load line;
   a plurality of pairs of sense amplifiers corresponding to the plurality of load lines such that each pair of sense amplifiers is configured to share the corresponding load line, wherein each pair of sense amplifiers comprises a first sense amplifier and a second sense amplifier, and wherein the first sense amplifiers are configured to sense for words of a first type and the second sense amplifiers are configured to sense for words of a second type;
   a redundant sense amplifier configured to drive a redundant read line;
   a plurality of multiplexers corresponding to the plurality of load lines, wherein a first multiplexer through a next-to-last multiplexer in the plurality of multiplexers are each configured to select between the corresponding load line and a subsequent load line, and wherein a last multiplexer in the plurality of multiplexers is configured to select between the last load line and the redundant read line; and
   a decoder configured to control the multiplexers to select for their corresponding load lines when a defect corresponds to one of the first sense amplifiers and a word of the second type is being read from the second sense amplifiers, the decoder being further configured to control the multiplexers to select for their corresponding load lines when a defect corresponds to one of the second sense amplifiers and a word of the first type is being read from the first sense amplifiers.

2. The memory of claim 1, wherein the decoder is further configured to control the multiplexers corresponding to a given one of the load lines through a next-to-last load line to shift to select for their subsequent load line and to control the last multiplexer to shift to select for the redundant read line when a word of the first type is being read from the memory and the first sense amplifier is defective in the sense amplifier pair corresponding to the given load line.

3. The memory of claim 2, wherein the decoder is further configured to control the multiplexers corresponding to the first load line through a preceding load line to select for their corresponding load line when a word of the first type is being read from the memory and the first sense amplifier is defective in the sense amplifier pair corresponding to the given load line, and wherein the given load line is a subsequent load line with regard to the preceding load line.

4. The memory of claim 1, wherein the decoder is further configured to control the multiplexers corresponding to a given one of the load lines through a next-to-last load line to shift to select for their subsequent load line and to control the last multiplexer to shift to select for the redundant load line when a word of the second type is being read from the memory and the second sense amplifier is defective in the sense amplifier pair corresponding to the given load line.

5. The memory of claim 4, wherein the decoder is further configured to control the multiplexers corresponding to the first load line through a preceding load line to select for their corresponding load line when a word of the second type is being read from the memory and the second sense amplifier is defective in the sense amplifier pair corresponding to the given load line, and wherein the given load line is a subsequent load line with regard to the preceding load line.

6. The memory of claim 1, wherein the memory comprises an SRAM.

7. The memory of claim 1, wherein each sense amplifier is configured to sense from a plurality of corresponding bit lines.

8. The memory of claim 1, further comprising a plurality of second pairs of sense amplifiers corresponding to the plurality of load lines such that each second pair of sense amplifiers is configured to share the corresponding load line, wherein each second pair of sense amplifiers comprises a third sense amplifier and a fourth sense amplifier, and wherein the third sense amplifiers are configured to sense for words of a third type and the fourth sense amplifiers are configured to sense for word of a fourth type.

9. A method for a memory configured to read a plurality of word types using a corresponding plurality of column types, the memory including a plurality of load lines, each load line driven by a corresponding load line set of the columns, each load line set including one column of each type, the method comprising:
responsive to a determination that a column of a first one of the types is defective and that remaining columns types are not defective, reading words of the remaining types from the memory through the load lines without any shifting; and
responsive to the determination that the column of the first type is defective, reading a word of the first type from the memory through shifted ones of the load lines and through a generic redundant read line driven by a single generic column.

10. The method of claim 9, wherein the memory includes a plurality of output multiplexers corresponding to the plurality of load lines, the method further comprising controlling each output multiplexer to select for its corresponding load line while reading the words of the remaining types.

11. The method of claim 10, wherein the load lines are arranged from a first load line to a last load line, and wherein the output multiplexers are arranged from a corresponding first output multiplexer to a corresponding last output multiplexer, and wherein reading the word of the first type from the memory through shifted ones of the load lines comprises determining which load line couples to a defective sense amplifier of the first type and controlling each output multiplexer from an output multiplexer corresponding to the determined load line through a next-to-last one of the load lines to select for a shifted load line and controlling the last multiplexer to select for the redundant read line.

12. The method of claim 11, wherein reading the word of the first type further comprises controlling each output multiplexer from the first output multiplexer through the preceding one of the output multiplexers to select for its corresponding load line, wherein the determined load line is a shifted load line with regard to the preceding load line.

13. The method of claim 9, further comprising:
responsive to a determination that a column of a second one of the types is defective, reading words of the remaining types besides the second type from the memory through the load lines without any shifting; and
responsive to the determination that the column of the second type is defective, reading a word of the second type from the memory through shifted ones of the load lines and through the generic redundant read line driven by the single generic column.

14. The method of claim 13, further comprising:
responsive to a determination that a column of a third one of the types is defective, reading words of the remaining types besides the third type from the memory through the load lines without any shifting; and
responsive to the determination that the column of the third type is defective, reading a word of the third type from the memory through shifted ones of the load lines and through the generic redundant read line driven by the single generic column.

15. A memory comprising:
a plurality of column pairs, each column pair including a first sense amplifier and a second sense amplifier, the first sense amplifiers being configured to sense bits for first words and the second sense amplifiers being configured to sense bits for second words;
a plurality of load lines corresponding to the plurality of column pairs; and
means for selecting from the load lines to output a word, wherein the means is configured to select from shifted ones of the load lines when the word is a first word and one of the first sense amplifiers is defective, the means being further configured to select only from unshifted ones of the load lines when the word is a second word and one of the first sense amplifier is defective.

16. The memory of claim 15, wherein the means is further configured select from shifted ones of the load lines when the word is a second word and one of the second sense amplifiers is defective, the means being further configured select from unshifted ones of the load lines when the word is a first word and one of the second sense amplifiers is defective.

17. The memory of claim 16, further comprising a single redundant read line and wherein the means is further configured to select for the single redundant read line when selecting from the shifted ones of the load lines.

18. The memory of claim 15, wherein the memory is an SRAM.

19. The memory of claim 15, wherein each of the first and second sense amplifiers is configured to sense from a corresponding set of four bit lines.

20. The memory of claim 19, wherein the means includes a plurality of output multiplexers.

* * * * *